(12) United States Patent
Mun et al.

(10) Patent No.: US 11,257,949 B2
(45) Date of Patent: Feb. 22, 2022

(54) TRANSISTOR DEVICES AND METHODS OF FORMING TRANSISTOR DEVICES

(71) Applicant: GLOBALFOUNDRIES Singapore Pte. Ltd., Singapore (SG)

(72) Inventors: Bong Woong Mun, Singapore (SG); Jeoung Mo Koo, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/874,708

(22) Filed: May 15, 2020

(65) Prior Publication Data

US 2021/0359132 A1 Nov. 18, 2021

(51) Int. Cl.
| | |
|---|---|
| H01L 29/66 | (2006.01) |
| H01L 29/78 | (2006.01) |
| H01L 21/26 | (2006.01) |
| H01L 21/28 | (2006.01) |
| H01L 29/06 | (2006.01) |
| H01L 29/10 | (2006.01) |
| H01L 21/265 | (2006.01) |
| H01L 21/285 | (2006.01) |
| H01L 29/45 | (2006.01) |

(52) U.S. Cl.
CPC .... H01L 29/7825 (2013.01); H01L 21/26513 (2013.01); H01L 21/26586 (2013.01); H01L 21/28518 (2013.01); H01L 29/0653 (2013.01); H01L 29/1095 (2013.01); H01L 29/45 (2013.01); H01L 29/66704 (2013.01)

(58) Field of Classification Search
CPC .............. H01L 21/26; H01L 21/26513; H01L 21/26586; H01L 21/28; H01L 21/28518; H01L 29/063; H01L 29/45; H01L 29/66; H01L 29/78; H01L 29/66704; H01L 29/7825; H01L 29/1095
USPC .......................................................... 257/339
See application file for complete search history.

(56) References Cited

U.S. PATENT DOCUMENTS

| 8,709,899 B2 * | 4/2014 | Zuniga | H01L 29/7825 438/286 |
|---|---|---|---|
| 2009/0273030 A1 * | 11/2009 | Schrems | H01L 29/0847 257/337 |
| 2010/0032773 A1 * | 2/2010 | Shrivastava | H01L 29/0653 257/408 |
| 2015/0014768 A1 * | 1/2015 | Chen | H01L 29/0653 257/339 |

(Continued)

*Primary Examiner* — Fazli Erdem
(74) *Attorney, Agent, or Firm* — Viering Jentschura & Partner MBB

(57) ABSTRACT

An LDMOS transistor device may be provided, including a substrate having a conductivity region arranged therein, a first isolation structure arranged within the substrate, a source region and a drain region arranged within the conductivity region, a second isolation (local isolation) structure arranged between the source region and the drain region, and a gate structure arranged at least partially within the second isolation structure. The first isolation structure may extend along at least a portion of a border of the conductivity region, and a depth of the second isolation structure may be less than a depth of the first isolation structure. In use, a channel for electron flow may be formed along at least a part of a side of the gate structure arranged within the second isolation (local isolation) structure.

20 Claims, 19 Drawing Sheets

(56) References Cited

U.S. PATENT DOCUMENTS

2015/0137228 A1\* 5/2015 Lee ................... H01L 29/0886
257/337
2016/0111488 A1\* 4/2016 Lu ..................... H01L 29/0653
257/330

\* cited by examiner

TRANSISTOR DEVICES AND METHODS OF FORMING TRANSISTOR DEVICES

TECHNICAL FIELD

The present disclosure relates generally to transistor devices, and methods of forming the transistor devices.

BACKGROUND

Transistor devices are widely used in many applications to amplify or switch electric signals. One type of transistor device is the laterally-diffused metal-oxide semiconductor (LDMOS) device often used in radio frequency (RF) power amplifiers for mobile networks. An LDMOS device typically includes a source, a drain and a gate therebetween, where the source and the drain are arranged within respective wells of different conductivity types. When a sufficiently large gate voltage is applied to the gate of the LDMOS device, a channel may be formed in the well in which the source is arranged, allowing current flow between the source and the drain.

Conventional LDMOS devices often suffer from problems such as a high on-resistance, low breakdown voltage and high switching losses. To date, several techniques have been developed to address these problems. For example, an electrically insulating structure may be included within the well in which the drain is arranged, so as to improve the breakdown voltage of the device. However, this improvement in breakdown voltage may not be sufficient, and the on-resistance and switching losses of such an LDMOS device remain high. Further, the fabrication of conventional LDMOS devices often involve several etching processes. These processes are time-consuming and tend to introduce errors that may affect the performance of the resulting LDMOS device.

SUMMARY

According to various non-limiting embodiments, there may be provided a transistor device. The transistor device may include a substrate having a conductivity region arranged therein; a first isolation structure arranged within the substrate, where the first isolation structure may extend along at least a portion of a border of the conductivity region; a source region and a drain region arranged within the conductivity region; a second isolation structure arranged between the source region and the drain region, where a depth of the second isolation structure may be less than a depth of the first isolation structure; and a gate structure arranged at least partially within the second isolation structure.

According to various non-limiting embodiments, there may be provided a method of forming a transistor device. The method may include providing a substrate; forming a conductivity region within the substrate; forming a first isolation structure within the substrate, where the first isolation structure may extend along at least a portion of a border of the conductivity region; forming a second isolation structure within the conductivity region, where a depth of the second isolation structure may be less than a depth of the first isolation structure; forming a gate structure at least partially within the second isolation structure; and forming a source region and a drain region within the conductivity region, such that the second isolation structure may be arranged between the source region and the drain region.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

Figure 1A:
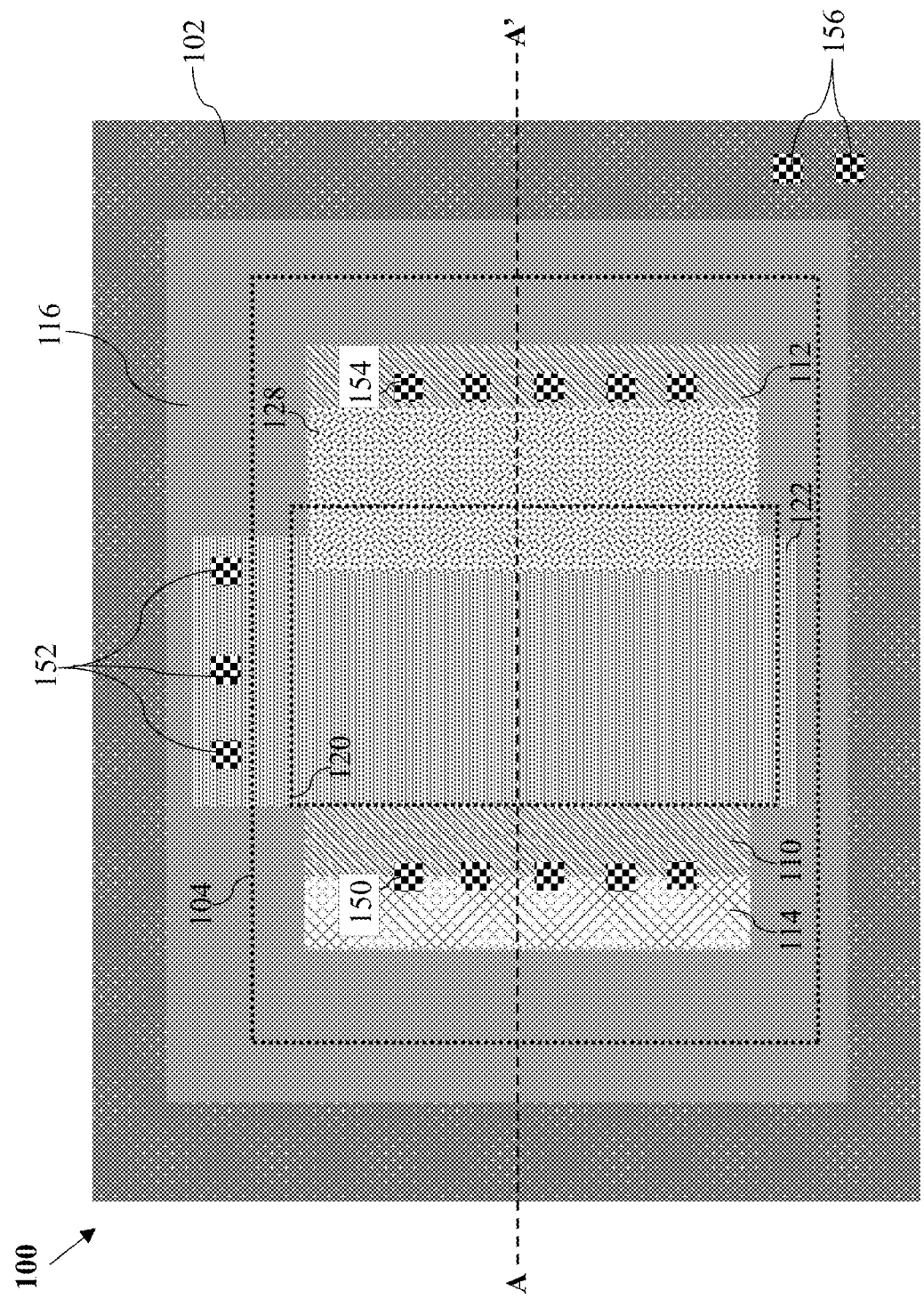
FIGS. 1A and 1B respectively show a simplified top view and a simplified cross-sectional view of a transistor device according to various non-limiting embodiments.

The embodiments generally relate to semiconductor devices. More particularly, some embodiments relate to transistor devices. For example, some embodiments may relate to LDMOS transistor devices. The transistor devices may, for example, be incorporated into power amplifiers and switches.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
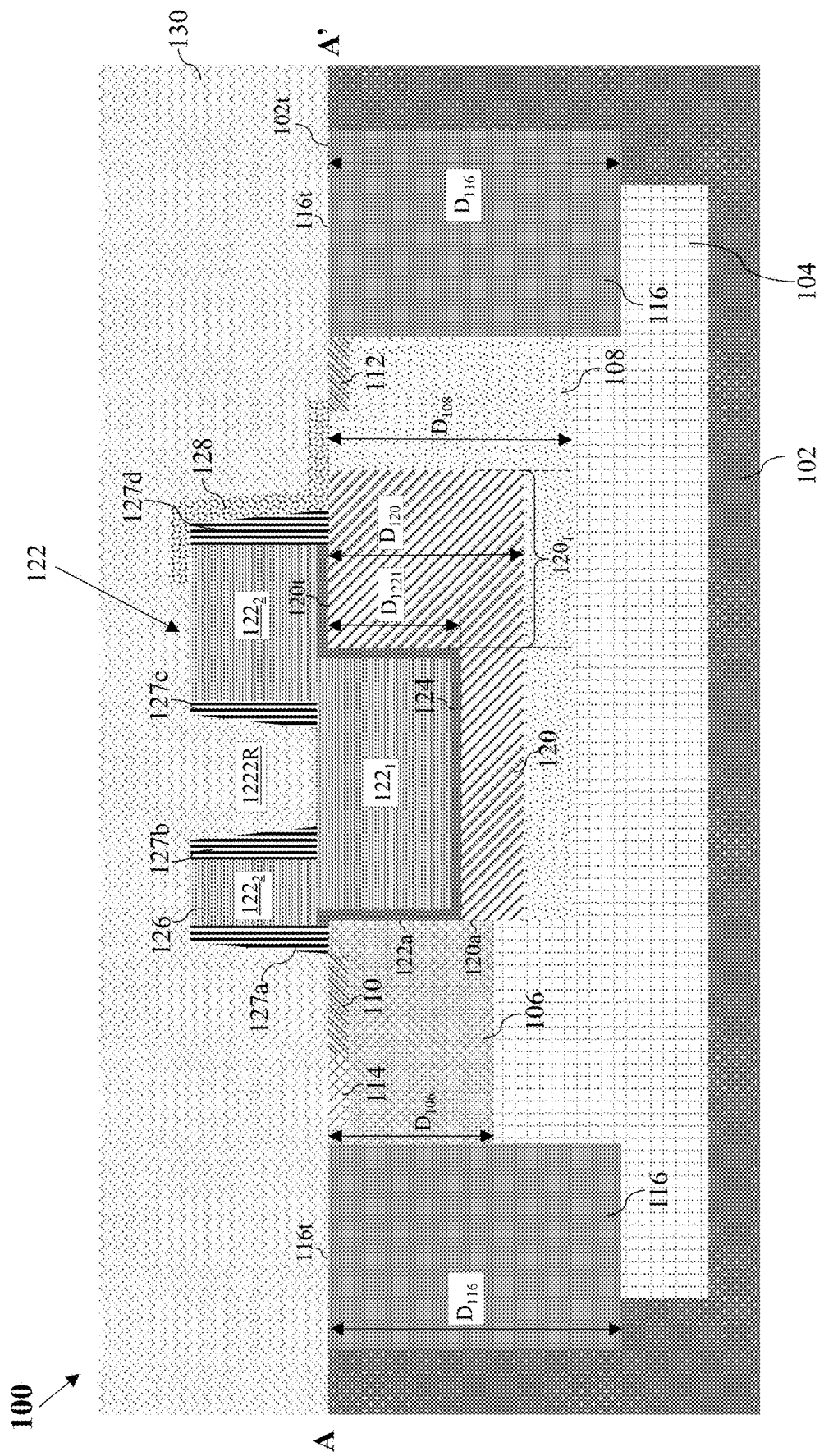

FIG. 1A shows a simplified top view of a transistor device 100 according to various non-limiting embodiments. FIG. 1B shows a simplified cross-sectional view of the transistor device 100 along the line A-A' of FIG. 1A. The transistor device 100 may be an LDMOS transistor device.

The transistor device 100 may include a substrate 102. The substrate 102 may be a semiconductor substrate. For example, the substrate 102 may include semiconductor material such as, but not limited to, silicon (Si), germanium (Ge), silicon carbide (SiC), gallium arsenide (GaAs), gallium nitride (GaN), or combinations thereof.

The substrate 102 may include a conductivity region 104 arranged therein. The conductivity region 104 may be a high voltage well region. A body region 106 and a drift region 108 may also be arranged within the substrate 102, in particular, within the conductivity region 104. As shown in FIG. 1B, the drift region 108 may adjoin the body region 106. The drift region 108 and the body region 106 may be arranged along the top surface 102t of the substrate 102. In addition, a depth $D_{106}$ of the body region 106 may be less than a depth $D_{108}$ of the drift region 108. The depth $D_{108}$ of the drift region 108 may be configured based on the voltage (Vdd) to be supplied to the transistor device 100.

The transistor device 100 may also include a source region 110 and a drain region 112. The source region 110 may be arranged within the conductivity region 104 (in particular, the body region 106), and the drain region 112 may be arranged within the conductivity region 104 (in particular, the drift region 108). In addition, the transistor device 100 may include a body contact 114 arranged within the body region 106, where the body contact 114 may adjoin the source region 110. The source region 110, the drain region 112 and the body contact 114 may be arranged along the top surface 102t of the substrate 102.

The transistor device 100 may be a positive-channel metal-oxide semiconductor (PMOS) device. In particular, the substrate 102, the drift region 108, the source region 110 and the drain region 112 may have a first conductivity type, or in other words, may include dopants of the first conductivity type. The conductivity region 104, the body region 106 and the body contact 114 may have a second conductivity type different from the first conductivity type, or in other words, may include dopants of the second conductivity type. For example, the substrate 102, the drift region 108, the source region 110 and the drain region 112 may be of p-type conductivity, and the conductivity region 104, the body region 106 and the body contact 114 may be of n-type conductivity. The p-type dopants may include boron (B), indium (In), or combinations thereof; whereas, the n-type dopants may include phosphorous (P), arsenic (As), antimony (Sb), or combinations thereof.

The transistor device 100 may further include a first isolation structure 116 arranged within the substrate 102. The first isolation structure 116 may extend along at least a portion of a border of the conductivity region 104. "Border" as used herein refers to a surface of the conductivity region 104 that faces the first isolation structure 116. The "border" is depicted with a dotted line within FIG. 1A. For example, as shown in FIG. 1A, the first isolation structure 116 may surround the conductivity region 104. In other words, the first isolation structure 116 may extend along an entire border of the conductivity region 104. However, the first isolation structure 116 may alternatively extend along only a portion of a border of the conductivity region 104. For example, the first isolation structure 116 may be arranged along at least 50% of the border of the conductivity region 104; alternatively, the first isolation structure 116 may be arranged along at least 70% of the border of the conductivity region 104, or even at least 90% of the border of the conductivity region 104.

As more clearly shown in FIG. 1B, the first isolation structure 116 may be arranged partially within the conductivity region 104. However, the first isolation structure 116 may alternatively be arranged entirely external to the conductivity region 104, but adjoining the border of the conductivity region 104, e.g. contacting a surface of the conductivity region 104 facing the first isolation structure 116. Further, as shown in FIG. 1B, the first isolation structure 116 may adjoin the body region 106 and the drift region 108. Although in FIG. 1B, the transistor device 100 is depicted with a part of the body region 106 between the body contact 114 and the first isolation structure 116, and with a part of the drift region 108 between the drain region 112 and the first isolation structure 116, the first isolation structure 116 may alternatively adjoin one or both of the drain region 112 and the body contact 114. The first isolation structure 116 may be a shallow trench isolation (STI) structure and may include isolation material. The isolation material may be dielectric material or gap fill oxide such as, but not limited to, silicon oxide, silicon nitride, silicon oxynitride, or combinations thereof. A depth $D_{116}$ of the first isolation structure 116 may be approximately equal to a depth of an isolation structure of a typical isolation device, and may be equal to or greater than 300 nm when the transistor device 100 is fabricated using the 180 nm to 130 nm technology node. For example, the depth $D_{116}$ of the first isolation structure 116 may be about 320 nm. However, the depth $D_{116}$ of the first isolation structure 116 may be different if other technology nodes are used for fabricating the transistor device 100.

The transistor device 100 may also include a second isolation structure 120 arranged within the substrate 102. The second isolation structure 120 may be arranged entirely within the conductivity region 104, in particular, within the drift region 108. In other words, the second isolation structure 120 may be a local isolation structure. As shown in FIG. 1B, the second isolation structure 120 may be arranged between the source region 110 and the drain region 112. The second isolation structure 120 may be laterally spaced apart from the drain region 112, or in other words, a part of the drift region 108 may be arranged between the second isolation structure 120 and the drain region 112. In particular, the second isolation structure 120 may be an ultra-shallow trench isolation (USTI) structure and may similarly include isolation material for example, dielectric material or gap fill oxide (such as, but not limited to, silicon oxide, silicon nitride, silicon oxynitride, or combinations thereof). Further, a top surface 120t of the second isolation structure 120 may be substantially laterally aligned with the top surface 116t of the first isolation structure 116 and with the top surface 102t of the substrate 102. A depth $D_{120}$ of the second isolation structure 120 is less than a depth $D_{116}$ of the first isolation structure 116. For example, the depth $D_{120}$ of the second isolation structure 120 may range from one-third of the depth $D_{116}$ of the first isolation structure 116 to two-thirds of the depth $D_{116}$ of the first isolation structure 116. In particular, the depth $D_{120}$ of the second isolation structure 120 may be equal to or less than 120 nm when the transistor device 100 is fabricated using the 180 nm to 130 nm technology node. For example, the depth $D_{120}$ of the second isolation structure 120 may be about 120 nm. However, the depth $D_{120}$ of the second isolation structure 120 may be different if other technology nodes are used for fabricating the transistor device 100.

The transistor device 100 may also include a gate structure 122 arranged at least partially within the second isolation structure 120. The gate structure 122 may be a vertical gate structure. In particular, as shown in FIG. 1B, a first part $122_1$ of the gate structure 122 may be arranged within the second isolation structure 120 and a second part $122_2$ of the gate structure 122 may be arranged over the substrate 102. In FIG. 1B, the second part $122_2$ of the gate structure 122 is depicted as having a trench 1222R over the first part $122_1$ of the gate structure 122, but this trench 1222R may be absent in alternative non-limiting embodiments.

Referring to FIG. 1B, a side 122a of the gate structure 122 facing the source region 110 may be vertically aligned with a side 120a of the second isolation structure 120, and a portion $120_1$ of the second isolation structure 120 may extend from the gate structure 122 towards the drain region 112. As shown in FIG. 1B, the portion $120_1$ of the second isolation structure 120 may extend beyond the gate structure 122. The body region 106 may be arranged between the first isolation structure 116 and the gate structure 122. The gate structure 122 may adjoin the body region 106 along the side 122a of the gate structure 122, and the second isolation structure 120 may adjoin the body region 106 along the side 120a of the second isolation structure 120. As shown in FIG. 1B, the source region 110 may be arranged within the body region 106, and may be spaced apart from the gate structure 122. In other words, a part of the body region 106 may be arranged between the source region 110 and the gate structure 122. As will be elaborated below with reference to FIG. 3, a vertical channel region may be formed in the body region 106 along at least a part of the side 122a of the gate structure 122. Further, the depth $D_{106}$ of the body region 106 may be between the depth $D_{120}$ of the second isolation structure 120 and the depth $D_{1221}$ of the gate structure 122 arranged within the second isolation structure 120 (in other words, the depth $D_{1221}$ of the first part $122_1$ of the gate structure 122). In particular, the depth $D_{106}$ may be less than the depth $D_{120}$ but greater than the depth $D_{1221}$.

Referring to FIG. 1B, the gate structure 122 may include a gate oxide layer 124 and a gate element 126. The gate oxide layer 124 may extend along the top surface 102t of the substrate 102 over the body region 106, along the body region 106 and the second isolation structure 120, and further along the top surface 102t of the substrate 102 over the second isolation structure 120. The gate element 126 may be arranged over the gate oxide layer 124. The gate oxide layer 124 may include gate oxide material such as, but not limited to, silicon dioxide; whereas, the gate element 126 may include conductive material such as, but not limited to, polysilicon or metals (for example, titanium nitride, tantalum nitride, tungsten, alloys thereof or combinations thereof).

The transistor device 100 may further include spacers 127a, 127b, 127c, 127d arranged along sides of the gate element 126. The spacers 127a, 127b, 127c, 127d may include dielectric material, such as, but not limited to, silicon oxide, silicon nitride, silicon oxynitride, or combinations thereof. For clarity of illustration, the spacers 127a, 127b, 127c, 127d are not shown in FIG. 1A.

The transistor device 100 may further include a silicide block layer 128 extending from above the second part $122_2$ of the gate structure 122 to the top surface 102t of the substrate 102. As shown in FIG. 1B, the silicide block layer 128 may further extend along the top surface 102t of the substrate 102 between the gate structure 122 and the drain region 112. Further, the silicide block layer 128 may overlap the drain region 112. The silicide block layer 128 may be a silicide alignment block (SAB) oxide layer and may include blocking material such as, but not limited to, silicon oxide, silicon nitride or combinations thereof.

As shown in FIG. 1B, the transistor device 100 may further include an insulating layer 130 arranged over the substrate 102. The second part $122_2$ of the gate structure 122 and the silicide block layer 128 may be arranged within the insulating layer 130. The insulating layer 130 may be an inter-layer dielectric (ILD) layer and may include insulating material such as, but not limited to, silicon oxide, silicon dioxide, silicon nitride or combinations thereof.

As shown in FIG. 1A, the transistor device 100 may further include a plurality of first contacts 150 arranged over and in contact with the body region 114 and the source region 110, a plurality of second contacts 152 arranged over and in contact with the gate structure 122, a plurality of third contacts 154 arranged over and in contact with the drain region 112, and a plurality of fourth contacts 156 (that may be ground area contacts) arranged over and in contact with the substrate 102. The first, second, third and fourth contacts 150, 152, 154, 156 may be conductive contacts including conductive material such as, but not limited to, aluminum, copper, tungsten, alloys thereof or combinations thereof.

FIGS. 2A to 2L show simplified cross-sectional views illustrating a method of forming the transistor device 100 according to various non-limiting embodiments. For clarity of illustration, some reference numerals have been omitted from FIGS. 2A to 2L.

Figure 2A:
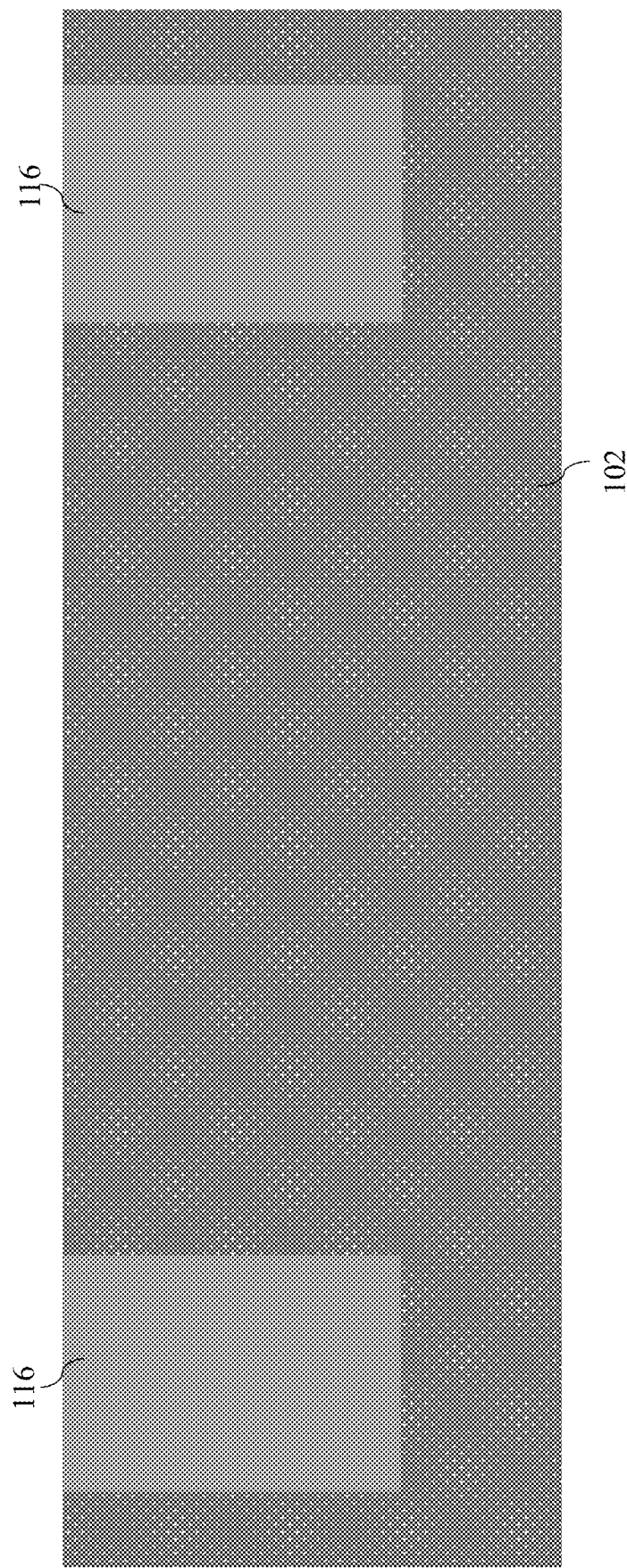
FIGS. 2A to 2L show simplified cross-sectional views illustrating a method of forming the transistor device of FIGS. 1A and 1B according to various non-limiting embodiments.
Figure 2B:
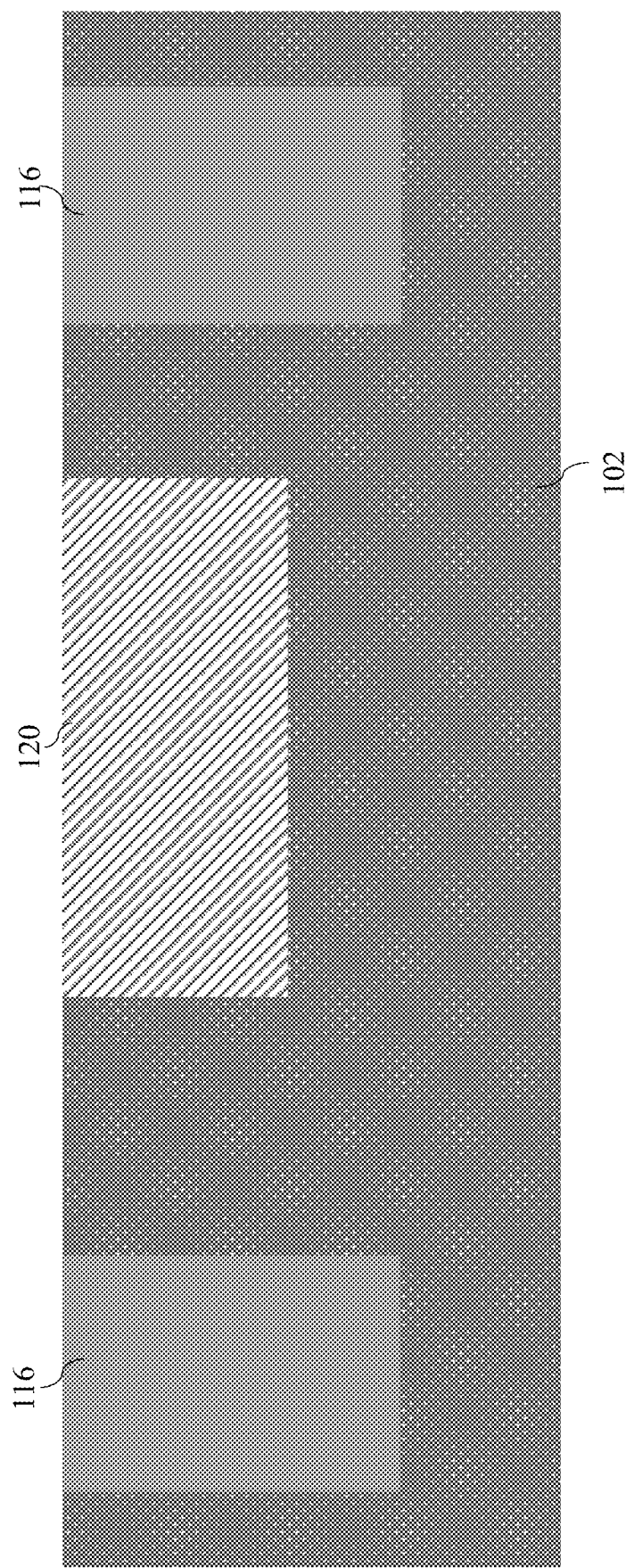

Referring to FIGS. 2A and 2B, the method may include providing the substrate 102, and forming the first isolation structure 116 and the second isolation structure 120 within the substrate 102. The first isolation structure 116 may be formed by etching the substrate 102 to form an opening and filling this opening with isolation material. Thereafter, the second isolation structure 120 may similarly be formed by etching the substrate 102 to form an opening and filling the opening with isolation material. Alternatively, the openings for both the first and second isolation structures 116, 120 may be filled with isolation material simultaneously. Further, after filling the openings with isolation material, a smoothing process (for example, a chemical mechanical polishing (CMP) process) may be performed to remove isolation material external of the substrate 102, so that the top surfaces 116$t$, 120$t$ of the isolation structures 116, 120 may be aligned with each other and with the top surface 102$t$ of the substrate 102.

Figure 2C:
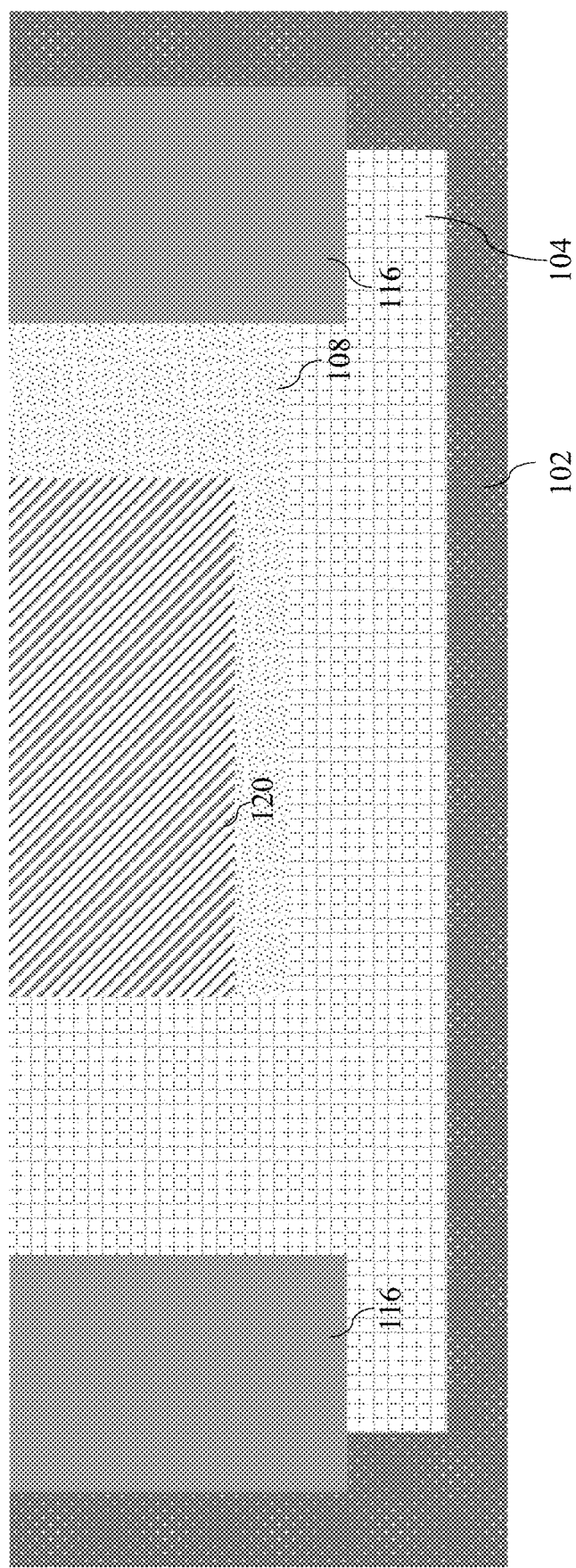

Referring to FIG. 2C, the method may further include forming the conductivity region 104 within the substrate 102 and forming the drift region 108 within the conductivity region 104. The conductivity region 104 and the drift region 108 may be formed by depositing dopants into respective regions of the substrate 102.

Figure 2D:
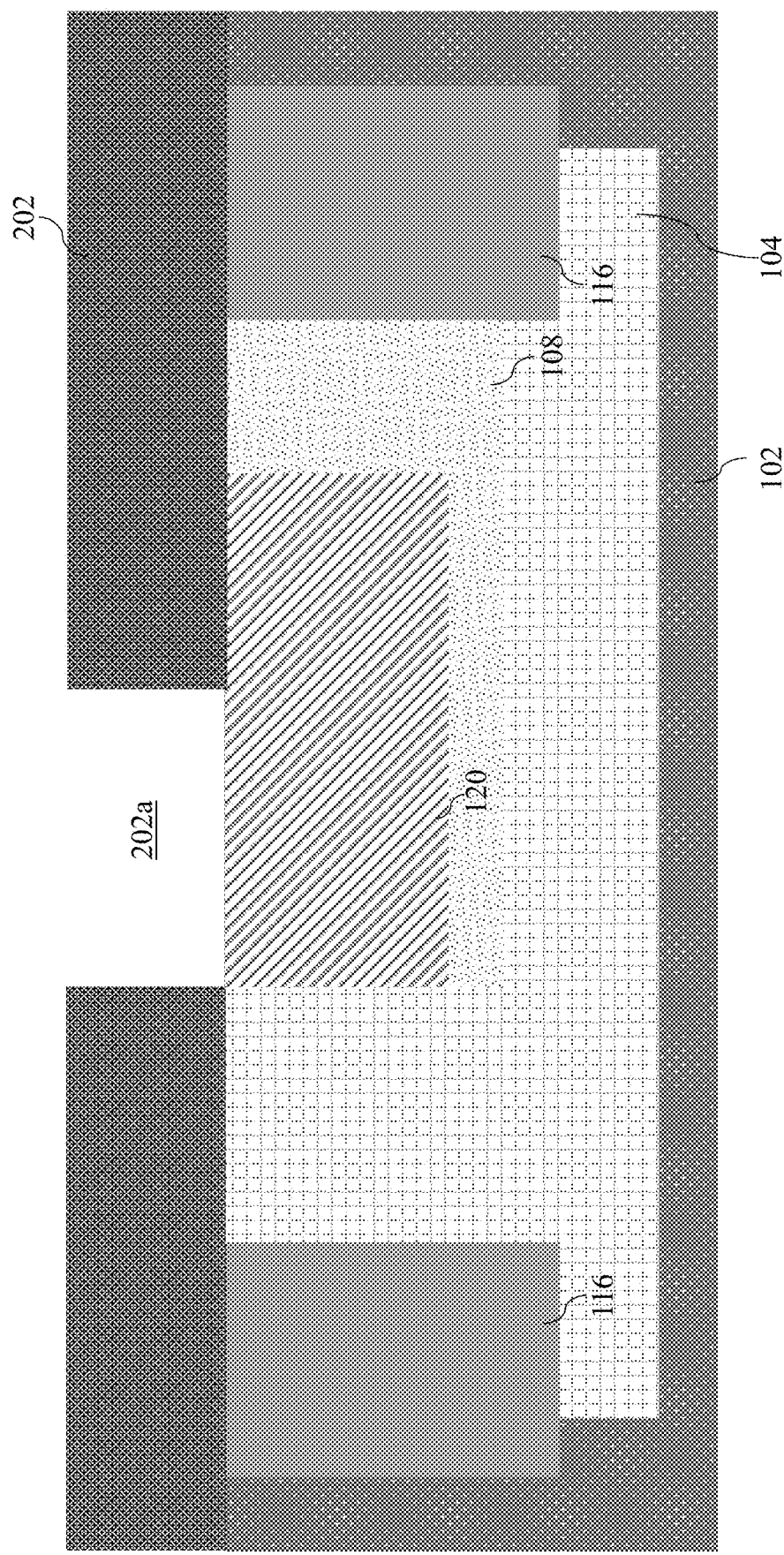
Figure 2E:
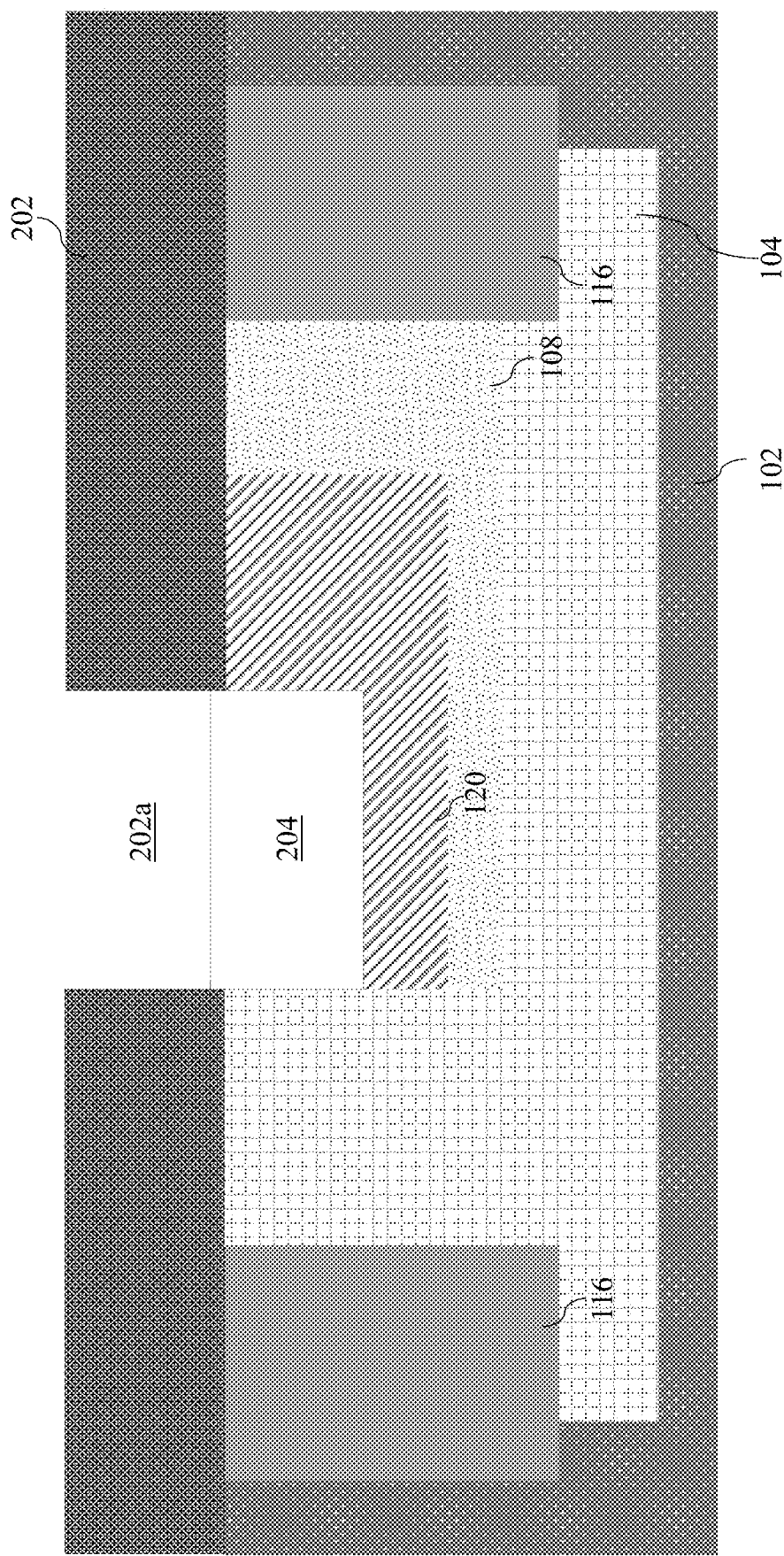
Figure 2F:
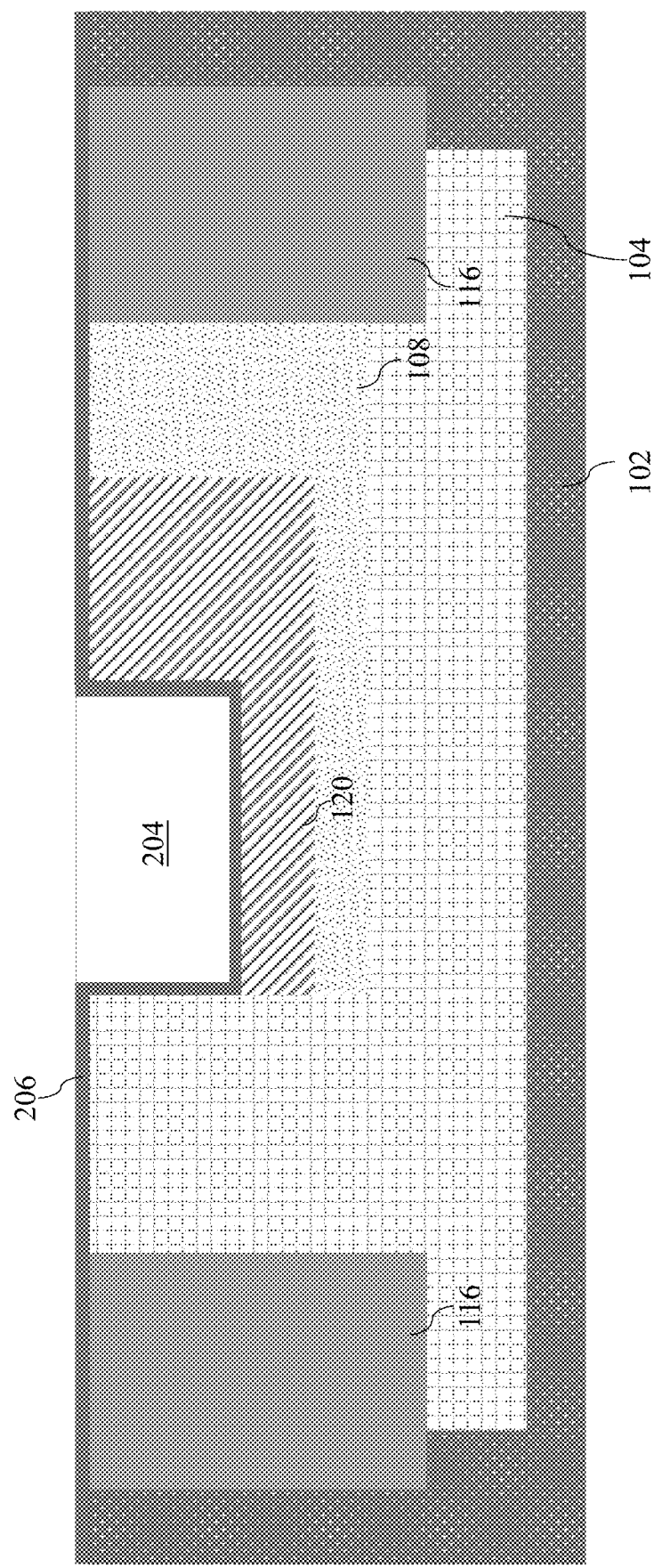
Figure 2G:
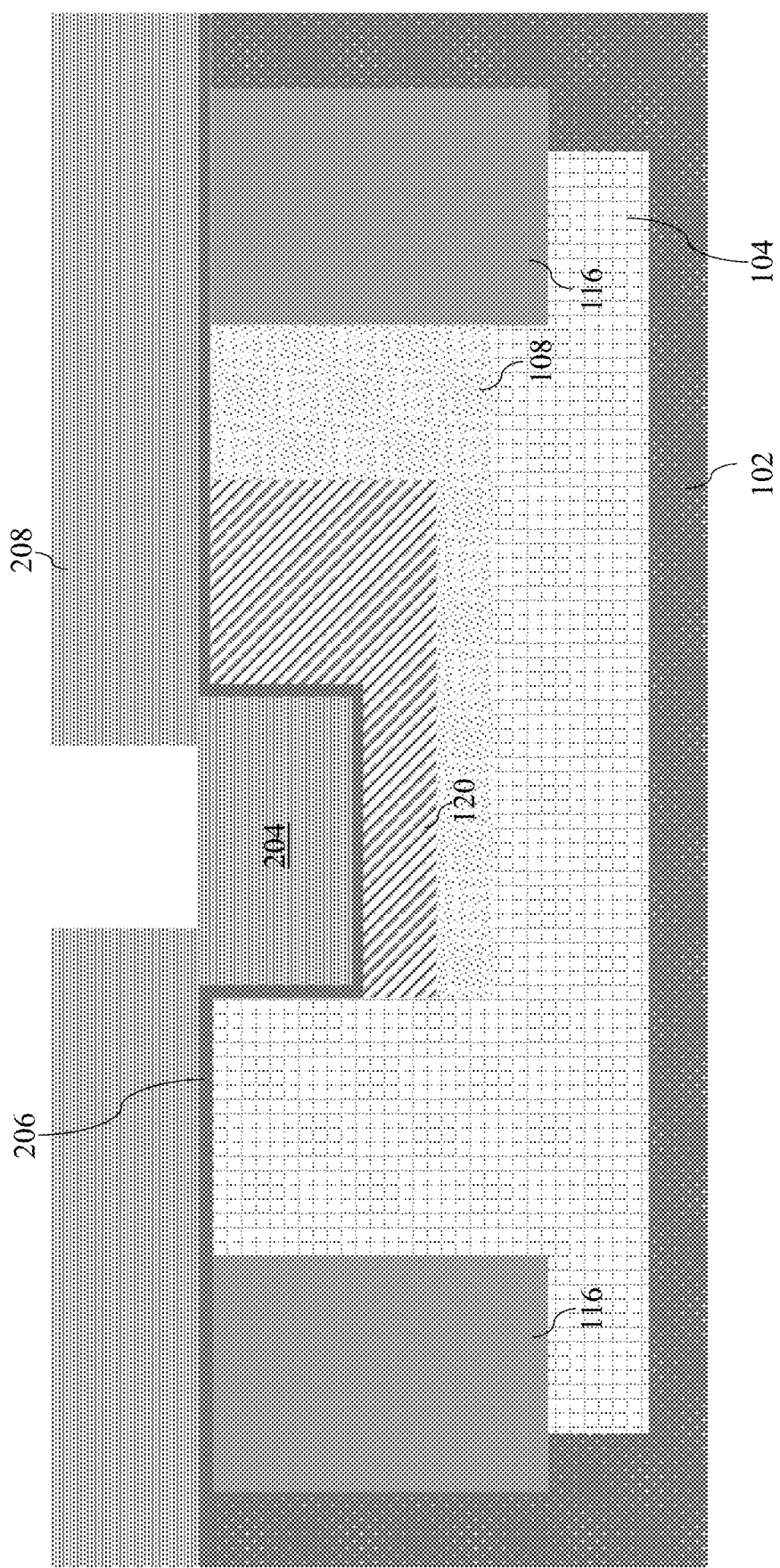
Figure 2H:
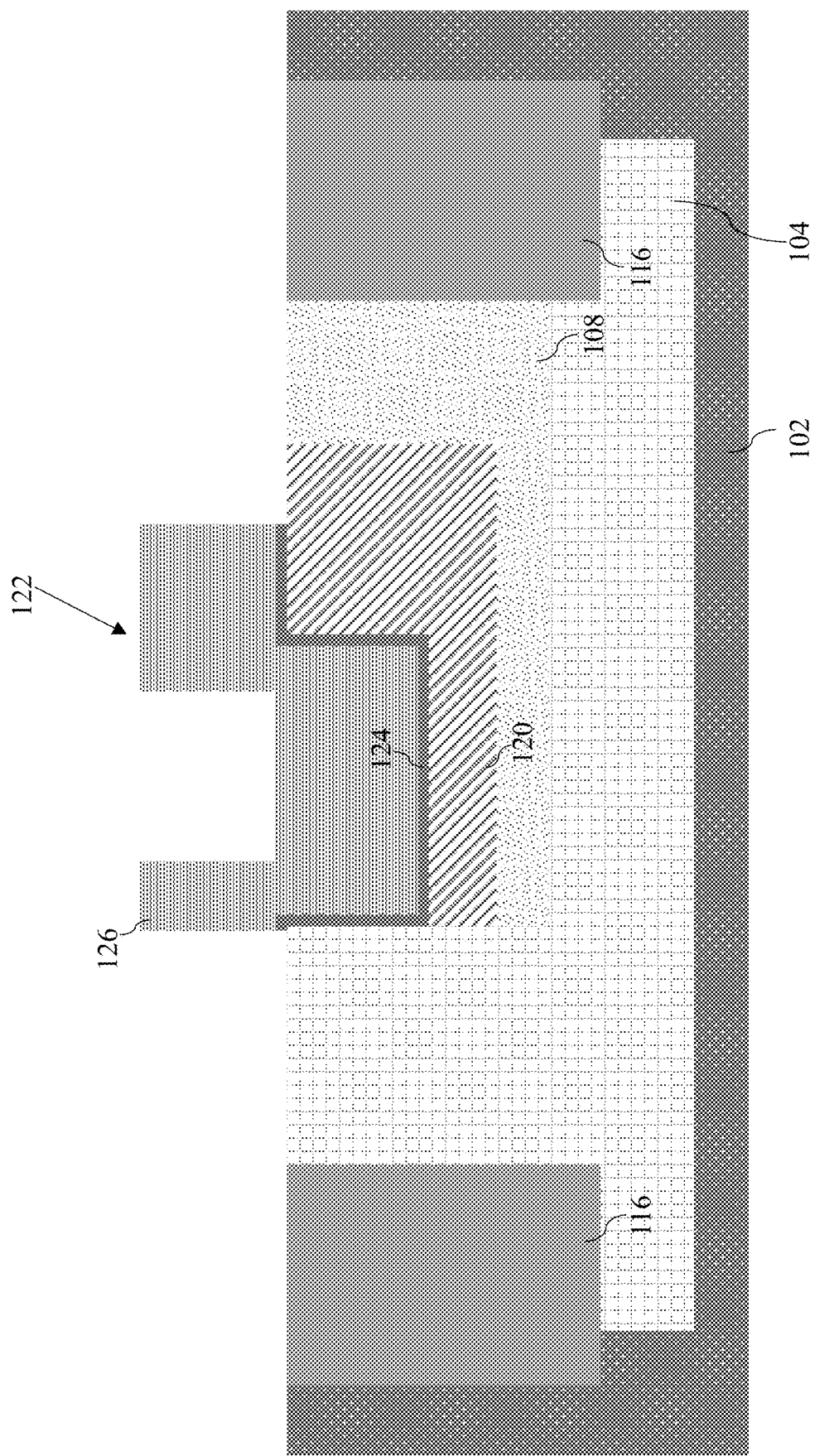

Referring to FIGS. 2D-2H, the method may further include forming the gate structure 122 at least partially within the second isolation structure 120. As shown in FIG. 2D, a mask 202 having an opening 202$a$ may be formed over the substrate 102. As shown in FIG. 2E, the substrate 102 may be etched through the opening 202$a$ of the mask 202 to form a trench 204 extending into the second isolation structure 120. As shown in FIG. 2F, a layer of gate oxide material 206 may be formed over the substrate 102, with a part of it formed within the trench 204. The layer of gate oxide material 206 may be thermal oxide formed by oxidizing a surface of the substrate 102. As shown in FIG. 2G, a layer of conductive material 208 may then be formed over the gate oxide material 206, similarly with a part of it formed within the trench 204. As shown in FIG. 2H, a portion of the gate oxide material 206 and a portion of the conductive material 208 may be removed (for example, with a single etching process using another mask) to form the gate structure 122. In particular, the remaining gate oxide material 206 may form the gate oxide layer 124 and the remaining conductive material 208 may form the gate element 126.

Figure 2I:
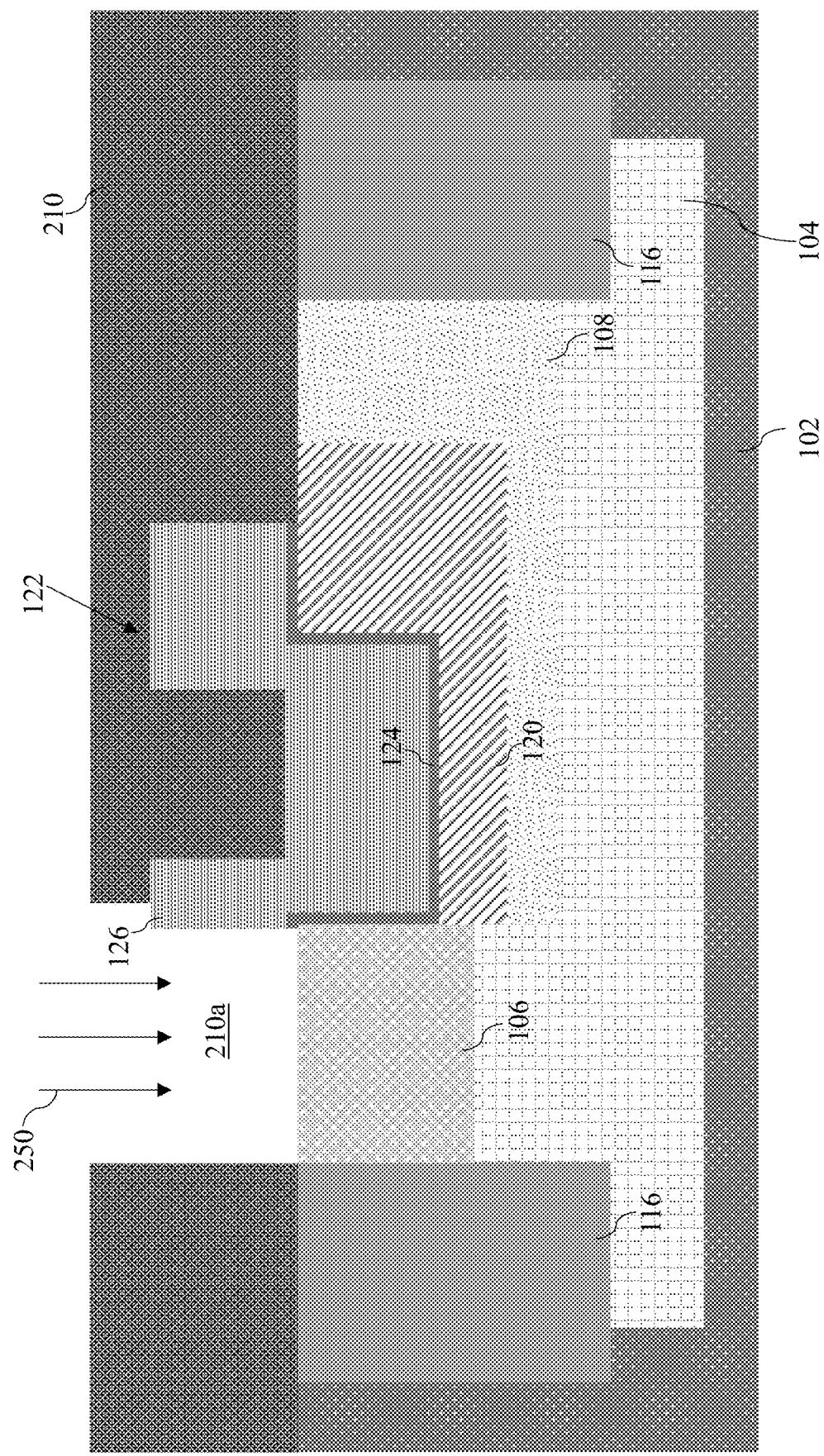

Referring to FIG. 2I, the method may further include forming the body region 106 within the conductivity region 104. To form the body region 106, a further mask 210 with an opening 210$a$ may be formed over the substrate 102 and over the gate structure 122. Dopants may then be deposited into the substrate 102 through the opening 210$a$ of the further mask 210. As indicated by the arrows 250, the dopants may be deposited into the substrate 102 at an angle substantially perpendicular to the top surface 102$t$ of the substrate 102.

Figure 2J:
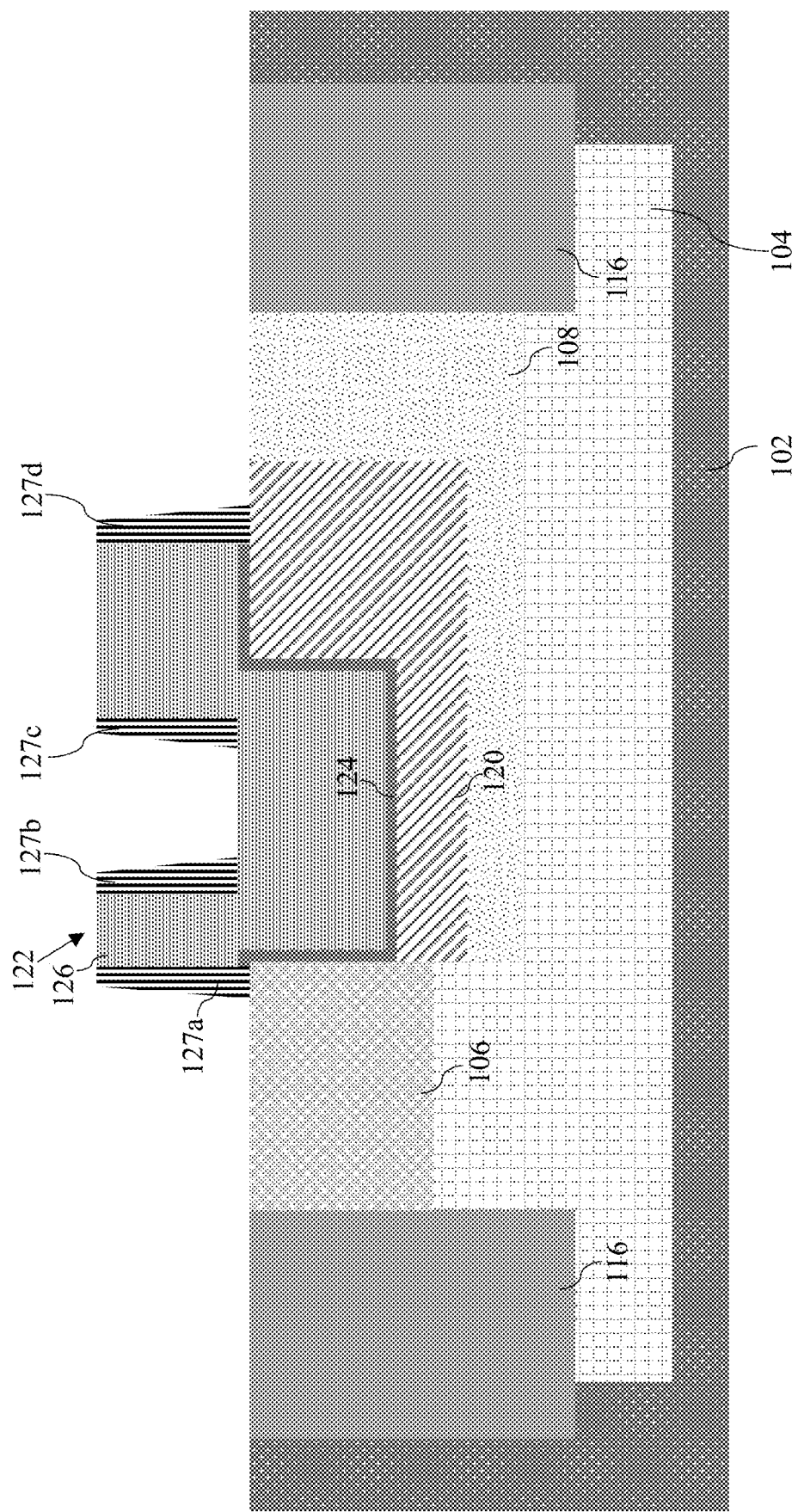

Referring to FIG. 2J, the method may further include forming the spacers 127$a$, 127$b$, 127$c$, 127$d$ along the sides of the gate element 126. The spacers 127$a$, 127$b$, 127$c$, 127$d$ may be formed by depositing dielectric material over the substrate 102 and the gate element 126, and etching the dielectric material.

Figure 2K:
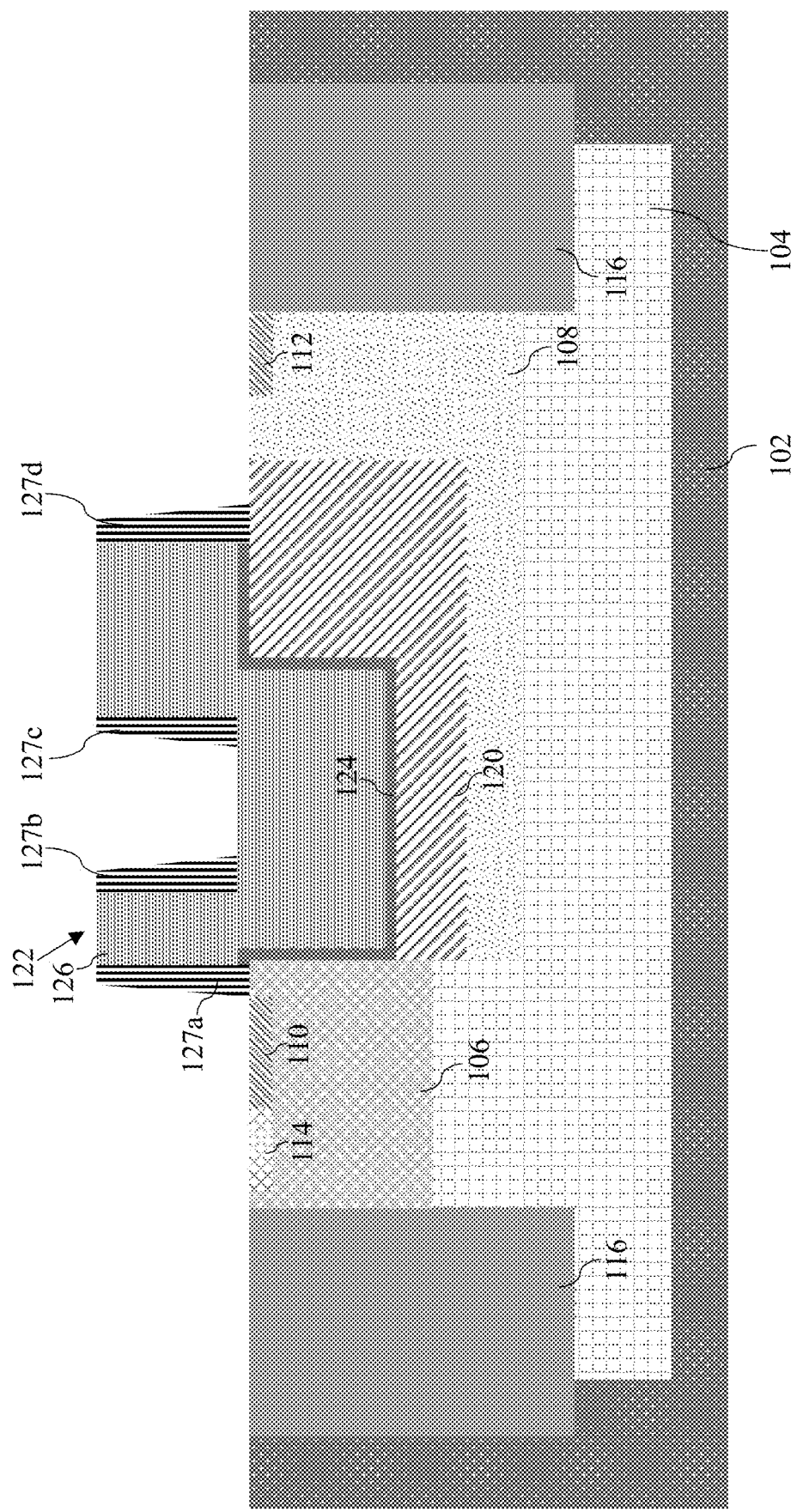

Referring to FIG. 2K, the method may further include forming the source region 110, the drain region 112 and the body contact 114. The source region 110, drain region 112 and body contact 114 may be formed by injecting dopants into the respective regions 106, 108 using for example, ion implantation. Alternatively, the source region 110, drain region 112 and body contact 114 may be formed by forming masks over the substrate 102 and doping the respective regions of the substrate 102 through openings of these masks.

Figure 2L:
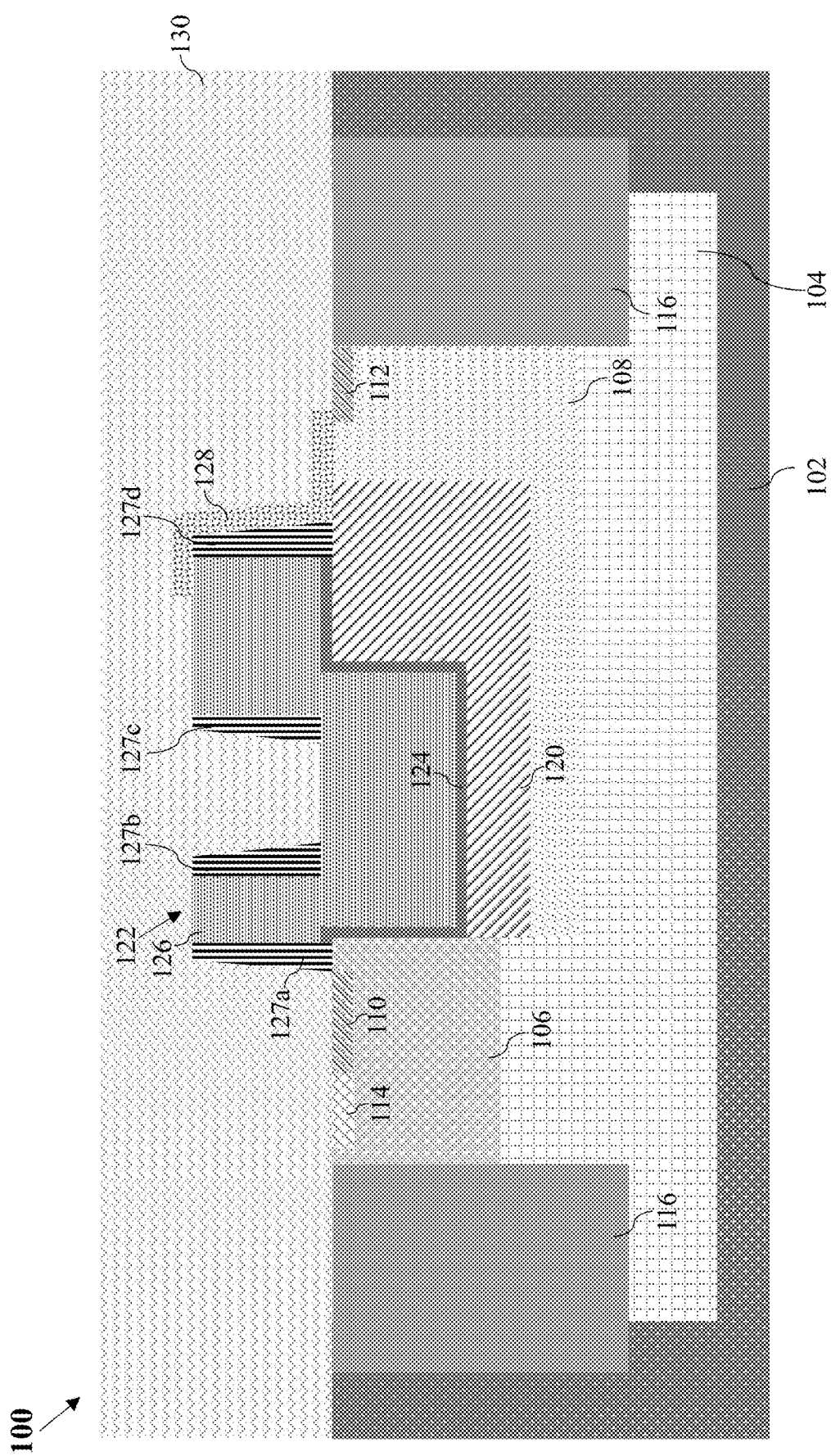

Referring to FIG. 2L, the method may further include forming the silicide block layer 128. The silicide block layer 128 may be formed by depositing blocking material over the gate structure 122 and the substrate 102, and etching the blocking material. The method may also include forming the insulating layer 130 by depositing insulating material over the substrate 102.

The above described order for the method is only intended to be illustrative, and the method is not limited to the above specifically described order unless otherwise specifically stated.

Figure 3:
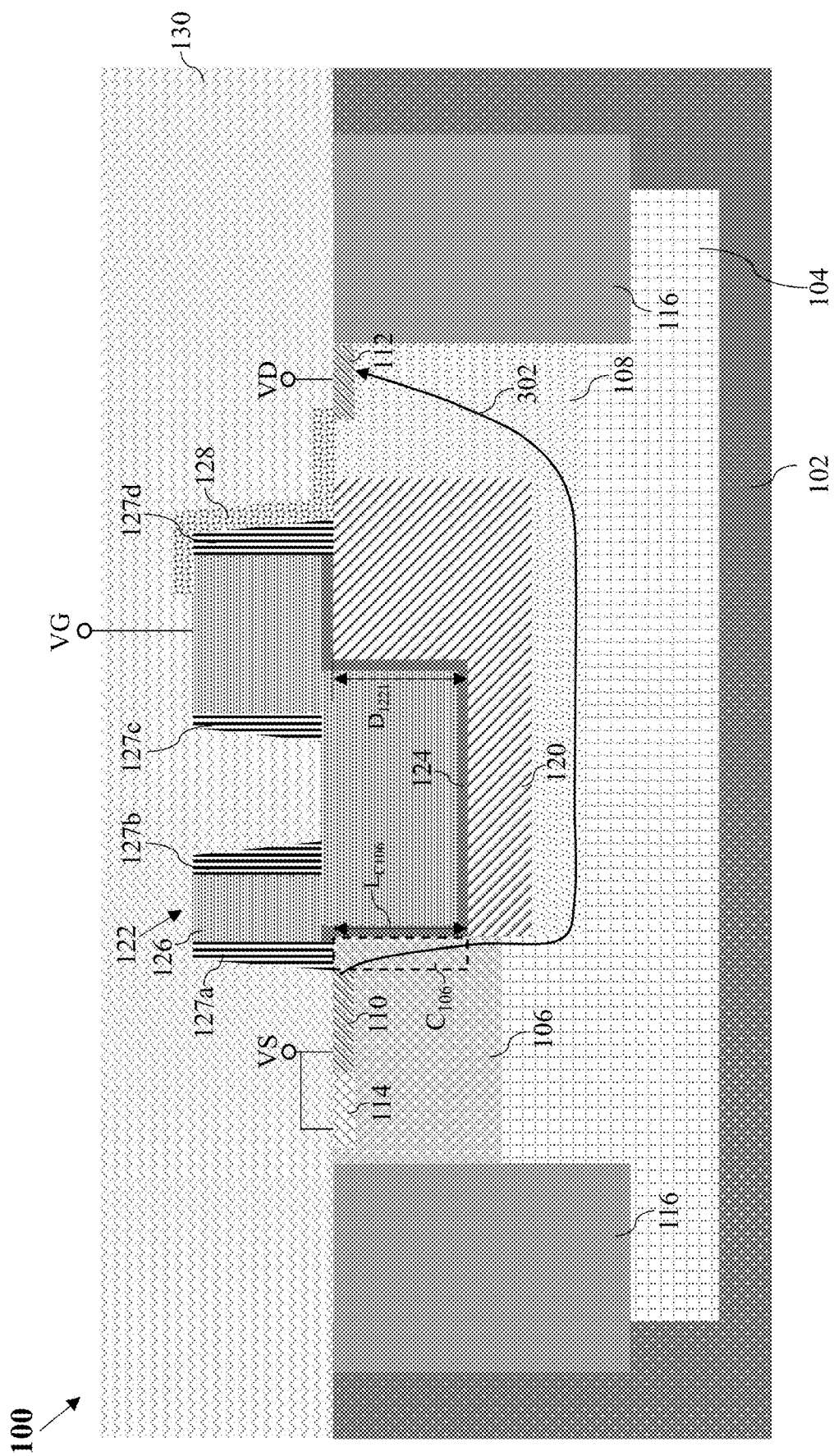
FIG. 3 shows a simplified cross-sectional view of the transistor device of FIGS. 1A and 1B when the transistor device is in use.

FIG. 3 shows the transistor device 100 in use, with the substrate 102, the drift region 108, the source region 110 and the drain region 112 having p-type conductivity, and the conductivity region 104, the body region 106 and the body contact 114 having n-type conductivity. Again, for clarity of illustration, some reference numerals have been omitted from FIG. 3.

As shown in FIG. 3, when the transistor device 100 is in use, a sufficiently large gate voltage (VG) may be applied to the gate structure 122 to form a vertical channel region $C_{106}$ within a portion of the body region 106 under the gate structure 122 and along the side 122$a$ of the gate structure 122. As shown in FIG. 3, a length $L_{C106}$ of the vertical channel region $C_{106}$ may be approximately equal to a depth $D_{122_1}$ of the first part 122$_1$ of the gate structure 122. By further applying a voltage difference (drain voltage (VD)–source voltage (VS)) between the source region 110 and the drain region 112, electrons may flow from the source region 110 to the drain region 112 (as indicated by the arrow 302). As shown in FIG. 3, the electrons may flow through the vertical channel region $C_{106}$ and through the drift region 108 under the second isolation structure 120. The source voltage VS, the gate voltage VG and the drain voltage VD may be applied using the first, second and third contacts 150, 152, 154 arranged over the source region 110, the gate structure 122 and the drain region 112 respectively. Since the first contacts 150 may be arranged over both the body contact 114 and the source region 110, the body contact 114 and the source region 110 may be tied to the same voltage VS. It is understood that the flow of electrons may be in the opposite direction, in particular, from the drain region 112 to the source region 110 if the first conductivity type and the second conductivity type are instead the n-type and the p-type respectively.

As compared to prior art transistor devices, the transistor device 100 may have a higher breakdown voltage (BV), a lower on-resistance (Ron) and improved switching performance such as lower switching losses. In other words, the transistor device 100 may have improved performance parameters such as an improved figure-of-merit (FOM=Ron×BV), an improved Baliga's figure-of-merit (BFOM=BV²/Ron) and an improved Ron×Qgg parameter, where Qgg represents the gate charge of the transistor device 100.

Figure 4:
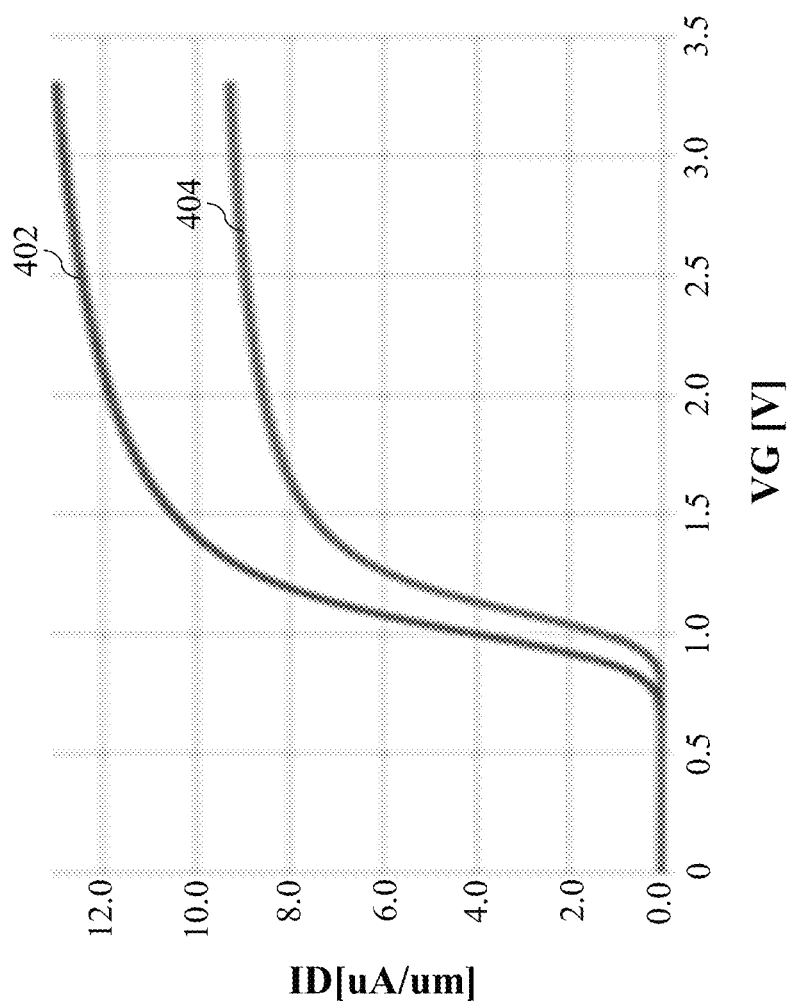
FIG. 4 shows plots illustrating the drain current to gate voltage relationship of the transistor device of FIGS. 1A and 1B and of another transistor device.

For example, by using the second isolation structure 120 with a smaller depth $D_{120}$, the doped area of the drift region 108 may be larger and the electric field within the drift region 108 may be reduced. Hence, the second isolation structure 120 may help to lower the on-resistance of the device 100. FIG. 4 shows plots 402, 404 respectively illustrating the drain current to gate voltage (ID-VG) relationship of the transistor device 100 and a transistor device similar to the transistor device 100 but with the second isolation structure 120 replaced by an isolation structure similar to the first isolation structure 116. The plots 402, 404 are obtained with the drain voltage (VD) set as 0.05V. As shown in FIG. 4, with the second isolation structure 120 in the drift region 108 in which the drain region 112 may be arranged, the on-resistance of the transistor device 100 may be reduced and the linear drain current $ID_{Lin}$ may improve.

Moreover, extending the gate structure 122 partially into the second isolation structure 120 may allow the formation of a vertical (as opposed to a horizontal) channel region $C_{106}$ when a sufficiently large gate voltage is applied to the gate structure 122. This can help to reduce the length of the channel region $C_{106}$ and in turn, the on-resistance of the transistor device 100 may be reduced. Further, the silicide blocking layer 128 may help to reduce the over voltage stress in the transistor device 100 under a high current situation. In addition, the body region 106 may help to reduce the on-resistance of the device 100. Also, with the portion $120_1$ of the second isolation structure 120 extending away from the gate structure 122 towards the drain region 112, a thicker gate to drain oxide layer may be provided in the transistor device 100 as compared to prior art devices. This can help reduce the gate to drain capacitance (Cgd) of the transistor device 100.

The fabrication of the transistor device 100 may also involve fewer etching processes. For example, the formation of the body region 106 of the transistor device 100 may be a self-controlled/self-aligned process (and thus, the body region 106 may be referred to as a self-aligned body implant). In particular, as described above with reference to FIGS. 2A to 2L, the body region 106 may be formed after forming the gate structure 122. Since the gate structure 122 may extend partially into the second isolation structure 120, the deposition of the dopants into the substrate 102 may be guided by the gate structure 122 to achieve an overlap between the body region 106 and the gate structure 122 along the side 122a. Therefore, after depositing the gate oxide material 206 and the conductive material 208, a single etching of these materials 206, 208 (instead of two separate etching processes) may be sufficient to form the gate structure 122 and expose a portion of the substrate 102 for forming the body region 106.

Figure 5:
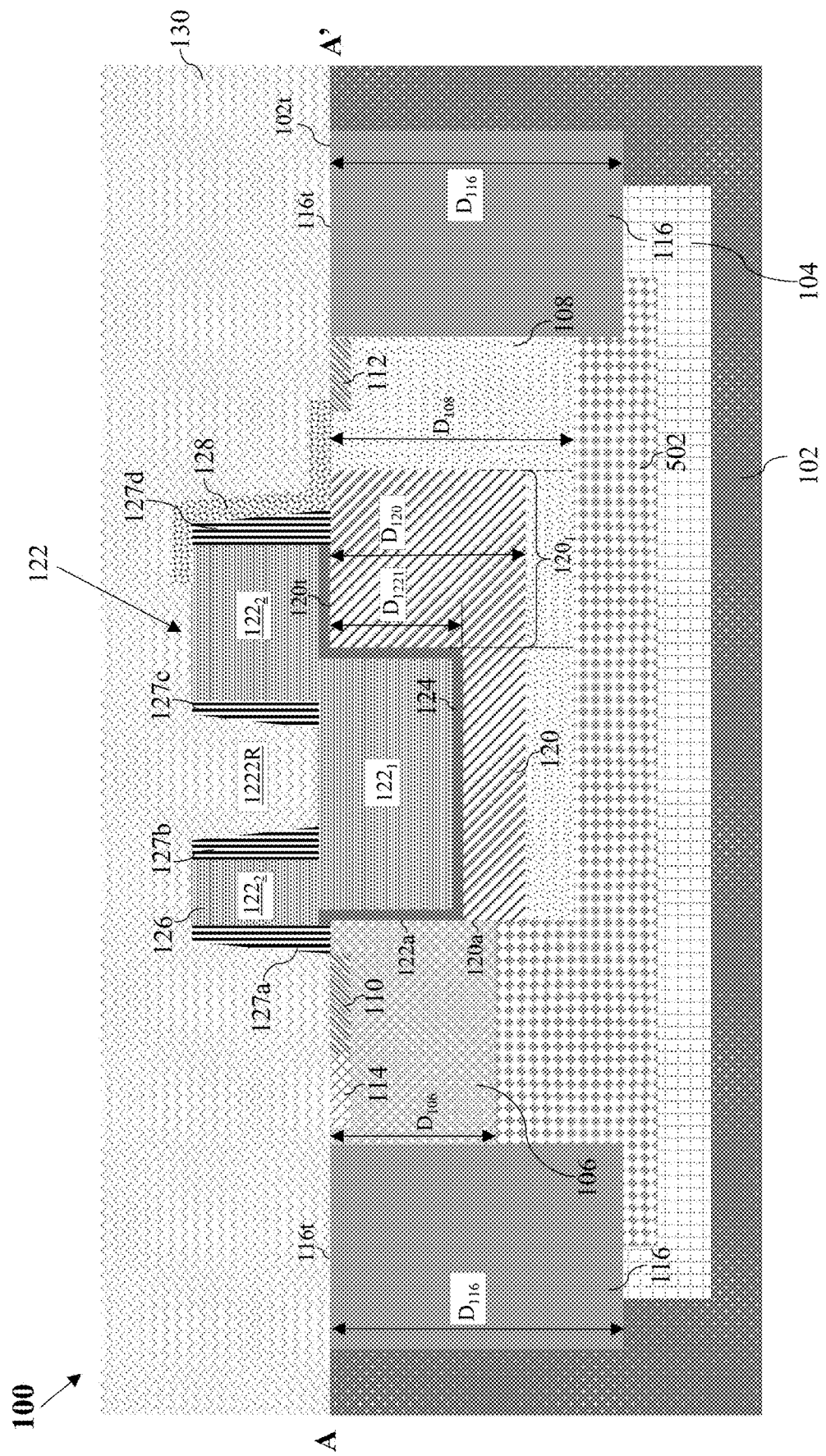
FIG. 5 shows a simplified cross-sectional view of a transistor device according to alternative non-limiting embodiments.

FIG. 5 shows a transistor device 500 according to alternative non-limiting embodiments. The transistor device 500 is similar to the transistor device 100, and thus, the common features are labelled with the same reference numerals and need not be discussed.

As compared to the transistor device 100, in the transistor device 500, the transistor device 500 may include a further conductivity region 502 arranged within the substrate 102, in particular, within the conductivity region 104. The further conductivity region 502 may be a high voltage well region. The body region 106 and the drift region 108 may be arranged within the further conductivity region 502. In other words, the source region 110, the drain region 112 and the body contact 114 may be arranged within the further conductivity region 502. The transistor device 500 may be a negative-channel metal oxide semiconductor (NMOS) device. In particular, the substrate 102, the further conductivity region 502, the body region 106 and the body contact 114 may have the first conductivity type; whereas, the conductivity region 104, the drift region 108, the source region 110 and the drain region 112 may have the second conductivity type. For example, the substrate 102, the further conductivity region 502, the body region 106 and the body contact 114 may be of p-type conductivity, and the conductivity region 104, the drift region 108, the source region 110 and the drain region 112 may be of n-type conductivity.

Figure 6:
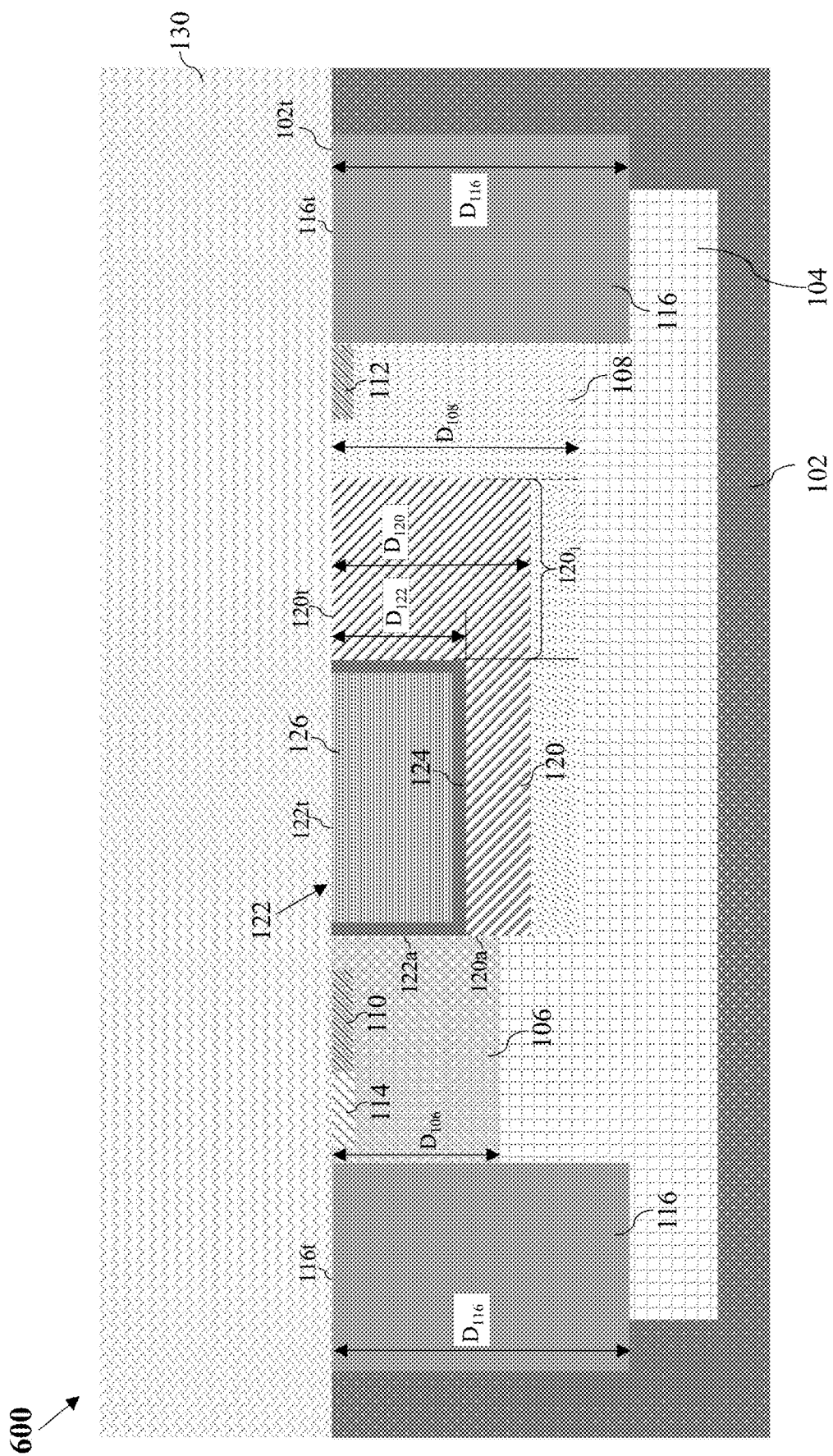
FIG. 6 shows a simplified cross-sectional view of a transistor device according to alternative non-limiting embodiments.

FIG. 6 shows a transistor device 600 according to alternative non-limiting embodiments. The transistor device 600 is similar to the transistor device 100, and thus, the common features are labelled with the same reference numerals and need not be discussed.

As compared to the transistor device 100, in the transistor device 600, the gate structure 122 may be arranged entirely within the second isolation structure 120. A top surface $122t$ of the gate structure 122 may be substantially aligned with the top surface $102t$ of the substrate 102 and a depth $D_{122}$ of the gate structure 122 within the second isolation structure 120 may be approximately equal to the depth $D_{122_1}$ in the transistor device 100. Further, the silicide block layer 128 may be absent in the transistor device 600. To form the gate structure 122 of the transistor device 600, instead of the etching process described above with reference to FIG. 2H, a smoothing process (for example, a CMP process) may be performed to remove the conductive material 208 and the gate oxide material 206 above the substrate 102. A deoxidation process (e.g. a poly deoxidation process) may also be performed to more thoroughly remove the conductive material 208 above the substrate 102.

Figure 7:
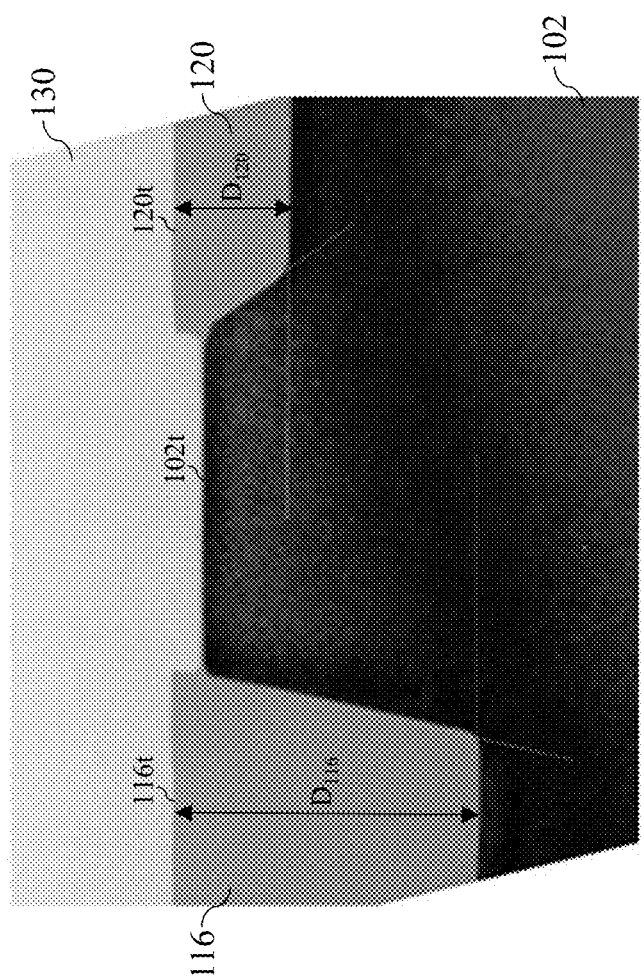
FIG. 7 shows a transmission electron microscopy (TEM) cross-sectional image of exemplary isolation structures that may be used in the transistor device of FIGS. 1A and 1B, 5 or 6.

In FIGS. 1, 5 and 6, the first isolation structure 116 and the second isolation structure 120 are depicted as having sides substantially perpendicular to their respective top surfaces $116t$, $120t$. However, the sides of these isolation structures 116, 120 may instead be sloping at an angle relative to their top surfaces $116t$, $120t$. When the transistor device 100 includes such isolation structures 116, 120, the side $122a$ of the gate structure 122 facing the source region 110 may also be sloping at an angle, such that it may be aligned with the sloping side of the second isolation structure 120 to adjoin the body region 106. Further, although the first and second isolation structures 116, 120 are depicted in FIGS. 1, 5 and 6 as being arranged entirely within the substrate 102, these isolation structures 116, 120 may alternatively extend beyond the top surface $102t$ of the substrate 102. For example, FIG. 7 shows a transmission electron microscopy (TEM) cross-sectional image of exemplary first and second isolation structures 116, 120 that may be used in the transistor device 100, where these isolation structures 116, 120 may have sloping sides and may extend beyond the top surface $102t$ of the substrate 102. As shown in FIG. 7, the top surface $116t$ of the first isolation structure 116 and the top surface $120t$ of the second isolation structure 120 may be substantially laterally aligned with each other above the top surface $102t$ of the substrate 102. The depth $D_{120}$ of the second isolation structure 120 (from its top surface $120t$) may be less than the depth $D_{116}$ of the first isolation structure 116 (from its top surface $116t$).

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A transistor device comprising:
a substrate having a conductivity region arranged therein;
a first isolation structure arranged within the substrate, wherein the first isolation structure extends along at least a portion of a border of the conductivity region;
a source region and a drain region arranged within the conductivity region;
a second isolation structure arranged between the source region and the drain region, wherein a depth of the second isolation structure is less than a depth of the first isolation structure; and
a gate structure arranged at least partially within the second isolation structure.

2. The transistor device of claim 1, wherein each of the first isolation structure and the second isolation structure comprises a dielectric material.

3. The transistor device of claim 1, further comprising a body region arranged between the first isolation structure and the gate structure, wherein the source region is arranged within the body region.

4. The transistor device of claim 3, wherein the gate structure adjoins the body region along a side of the gate structure.

5. The transistor device of claim 3, wherein a depth of the body region is between the depth of the second isolation structure and a depth of the gate structure arranged within the second isolation structure.

6. The transistor of claim 3, further comprising a body contact arranged within the body region, wherein the body contact adjoins the source region.

7. The transistor device of claim 1, further comprising a drift region arranged within the conductivity region, wherein the drain region and the second isolation region are arranged within the drift region.

8. The transistor device of claim 1, wherein the first isolation structure is arranged partially within the conductivity region.

9. The transistor device of claim 1, wherein the depth of the second isolation structure is less than or equal to 120 nm.

10. The transistor device of claim 1, wherein the depth of the second isolation structure ranges from one-third of the depth of the first isolation structure to two-thirds of the depth of the first isolation structure.

11. The transistor device of claim 1, wherein the second isolation structure is an ultra-shallow trench isolation structure.

12. The transistor device of claim 1, wherein a side of the gate structure facing the source region is aligned with a side of the second isolation structure.

13. The transistor device of claim 1, wherein a portion of the second isolation structure extends from the gate structure towards the drain region.

14. The transistor device of claim 1, wherein a first part of the gate structure is arranged within the second isolation structure and a second part of the gate structure is arranged over the substrate.

15. The transistor device of claim 14, further comprising a silicide block layer extending from above the second part of the gate structure to a top surface of the substrate.

16. The transistor device of claim 1, wherein the gate structure is arranged entirely within the second isolation structure.

17. A method of forming a transistor device, the method comprising:
providing a substrate;
forming a conductivity region within the substrate;
forming a first isolation structure within the substrate, wherein the first isolation structure extends along at least a portion of a border of the conductivity region;
forming a second isolation structure within the conductivity region, wherein a depth of the second isolation structure is less than a depth of the first isolation structure;
forming a gate structure at least partially within the second isolation structure; and
forming a source region and a drain region within the conductivity region, such that the second isolation structure is arranged between the source region and the drain region.

18. The method of claim 17, further comprising forming a body region between the first isolation structure and the gate structure.

19. The method of claim 18, wherein the body region is formed after forming the gate structure.

20. The method of claim 18, wherein forming the body region comprises depositing dopants into the substrate at an angle substantially perpendicular to a top surface of the substrate.

* * * * *